United States Patent
Sawadaishi

(10) Patent No.: US 11,881,414 B2
(45) Date of Patent: Jan. 23, 2024

(54) METHOD FOR MANUFACTURING GLASS DEVICE, AND GLASS DEVICE

(71) Applicant: TOPPAN PRINTING CO.,LTD., Tokyo (JP)

(72) Inventor: Masashi Sawadaishi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 617 days.

(21) Appl. No.: 17/113,929

(22) Filed: Dec. 7, 2020

(65) Prior Publication Data

US 2021/0118698 A1  Apr. 22, 2021

Related U.S. Application Data

(63) Continuation of application No. PCT/JP2019/022745, filed on Jun. 7, 2019.

(30) Foreign Application Priority Data

Jun. 8, 2018  (JP) ................. 2018-110668

(51) Int. Cl.
  *H01L 21/48* (2006.01)
  *H01L 23/15* (2006.01)
  (Continued)

(52) U.S. Cl.
  CPC .......... *H01L 21/4857* (2013.01); *H01L 23/15* (2013.01); *H01L 23/49822* (2013.01)

(58) Field of Classification Search
  CPC ............... H01L 23/15; H01L 23/49827; H01L 23/49822; H01L 21/486; C03C 23/0025; C03C 15/00
  See application file for complete search history.

(56) References Cited

U.S. PATENT DOCUMENTS

| 2015/0313020 A1* | 10/2015 | Takahashi | H05K 3/007 216/18 |
| 2017/0088457 A1* | 3/2017 | Mori | C03C 23/0025 |
| 2018/0221663 A1* | 8/2018 | Saini | A61N 1/3605 |

FOREIGN PATENT DOCUMENTS

| JP | S54-126215 A | 10/1979 |
| JP | 2000-061667 A | 2/2000 |

(Continued)

OTHER PUBLICATIONS

International Searching Authority, "International Search Report," issued in connection with International Patent Application No. PCT/JP2019/022745, dated Sep. 3, 2019.

(Continued)

*Primary Examiner* — Antonio B Crite
(74) *Attorney, Agent, or Firm* — Foley & Lardner LLP

(57) ABSTRACT

A glass device including a thin glass substrate which has a glass thickness of 300 μm or less is enabled to be provided more easily. In a method for manufacturing the glass device, one or more through holes are formed in a glass substrate, and a first wiring on a first surface side of the glass substrate and a second wiring on a second surface side of the glass substrate are electrically connected to each other via the through holes. After the first wiring is provided, the through holes are formed while the glass substrate is being thinned by etching. Then, wirings in the through holes and the second wiring are formed. The thinned glass substrate has a thickness of 50 μm or more and 300 μm or less. The through holes have the shape of a truncated cone.

8 Claims, 4 Drawing Sheets

(51) Int. Cl.
  *H01L 23/498*   (2006.01)
  *C03C 23/00*    (2006.01)
  *C03C 15/00*    (2006.01)
  *H01L 21/683*   (2006.01)

(56) References Cited

FOREIGN PATENT DOCUMENTS

| JP | 2001-105398 A    | 4/2001 |
| JP | 2015-082534 A    | 4/2015 |
| JP | 2016-072433 A    | 5/2016 |
| WO | WO-2014/080935 A1 | 5/2014 |
| WO | WO-2016/051781 A1 | 4/2016 |

OTHER PUBLICATIONS

International Searching Authority, "Written Opinion," issued in connection with International Patent Application No. PCT/JP2019/022745, dated Sep. 3, 2019.

Yoshinaga et al., "Trends in R&D in TSV Technology for 3D LSI Packaging," Science & Technology Trends, Quarterly Review No. 37, Oct. 2010, pp. 26-39.

* cited by examiner

RF

G-IP

METHOD FOR MANUFACTURING GLASS DEVICE, AND GLASS DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2019/022745, filed on Jun. 7, 2019, which is based upon and claims the benefit of priority to Japanese Patent Application No. 2018-110668, filed on Jun. 8, 2018, the disclosures of which are incorporated herein by reference in their entireties.

TECHNICAL FIELD

The present invention relates to a method for manufacturing a glass device having a glass substrate using through holes, and to the glass device.

BACKGROUND ART

Known examples of large-scale integration (LSI) packaging technologies include a packaging technology that uses through-silicon vias (TSVs). Silicon substrates having through electrodes are widely used as, for example, interposers. An interposer is a substrate that interfaces between substrates having different distances between terminals, such as an integrated circuit (IC) and a printed circuit board that have different wiring design rules.

As described in Non Patent Literature 1, a TSV formation method is known for forming TSVs in a silicon substrate before, after, or between steps for forming devices including transistors and circuits including electrodes.

Silicon substrates are expensive, as well as silicon is a semiconductor. Thus, TSV technology requires an insulation process after the formation of through holes in a silicon substrate, resulting in higher substrate cost. To reduce the cost of interposers, attention has been given to, for example, glass substrates having through electrodes, or inexpensive and large-area glass substrates in which through-glass vias (TGVs) are formed.

When a glass substrate having through electrodes is used, through holes need to be formed in the glass substrate with the TGV technology. Known examples of technologies for forming through holes in a glass substrate include, as described in Patent Literature 1, a technology for forming through holes by irradiation with a pulsed oscillation YAG laser.

Patent Literature 2 also describes a method for forming fine holes in a photosensitive glass substrate. In the method described in Patent Literature 2, a photomask is placed on a photosensitive glass substrate in a predetermined position, and irradiated with ultraviolet radiation to form latent images. Next, the photosensitive glass substrate is heated to crystallize the latent images. Then, at the center of each latent image, a processed lead hole smaller than the latent image is formed using a laser beam. Then, etching is performed using hydrogen fluoride, and the crystallized portions are selectively etched into holes.

Patent Literature 3 also describes a method for forming holes in a plate glass using a pair of upper and lower coaxial core drills facing each other across the plate glass.

CITATION LIST

[Patent Literature] [PTL 1] JP 2000-61667 A; [PTL 2] JP 2001-105398 A; [PTL 3] JP S54-126215 A

[Non-Patent Literature] [NPL 1] Takashi YOSHINAGA and Minoru NOMURA, "Trends in R&D in TSV Technology for 3D LSI Packaging", Science & Technology Trends, No. 10, April 2010, National Institute of Science and Technology Policy.

SUMMARY OF THE INVENTION

Technical Problem

The formation of through holes in a glass substrate may deteriorate the mechanical strength of the glass substrate. In particular, for glass having a thickness of 300 μm or less, the reduced mechanical strength may lead to cracks in the glass in a conveyance step during which circuits or other conductive portions are formed. Such a glass substrate is difficult to deal with.

In the TSV technology, techniques such as the Bosch process, in which dry etching is used, have been established as methods for forming through holes in silicon substrates. However, the formation of through holes in a glass substrate by dry etching takes a long time and may not be practical. In particular, the formation of through holes for a glass thickness of 300 μm or less and application to an electronic device substrate such as an interposer have quite a high level of technical difficulty and may not be practical.

The present invention has been made in view of the above problems, and an object of the invention is to enable a glass device having a glass substrate with a glass thickness of 300 μm or less to be provided more easily.

Solution to Problem

To solve the problems, a method for manufacturing a glass device according to an aspect of the present invention is a method for manufacturing the glass device having one or more through holes formed in a glass substrate, and first wiring on a first surface of the glass substrate and second wiring on a second surface opposite to the first surface being electrically connected to each other via the through holes. In the method, after the first wiring is provided, the through holes are formed while the glass substrate is being thinned by etching. Then, wiring in the through holes are provided and the second wiring is formed. The first wiring and the second wiring are connected to each other via the wiring in the through holes. The thinned glass substrate has a thickness of 50 μm or more and 300 μm or less. The through holes have a shape of truncated cones, and have a second surface side opening being a bottom surface, wherein a ratio of (second surface side opening diameter/first surface side opening diameter) which is a relationship between a diameter of a first surface side opening and a diameter of the second surface side opening is 1.8 or more and 2.2 or less.

A method for manufacturing a glass device according to another aspect of the present invention includes the steps of: providing a first wiring on a first surface of a glass substrate; supporting a first wiring side of the glass substrate provided with the first wiring, using a support body; forming a laser modified area using laser light applied to a surface opposite to the first surface, the laser modified area extending from the first surface of the glass substrate to a surface opposite to the first surface and serving as an area in which a through hole is formed; forming a through hole while thinning the glass substrate by etching using a hydrogen fluoride etchant toward the first surface from the surface opposite to the first surface of the glass substrate, after the step of supporting the first wiring side of the glass substrate and the step of forming the laser modified area; forming a through electrode inside the through hole, and providing a second wiring on a surface opposite to the first surface of the glass substrate, and connecting the first wiring and the second wiring to each other via the through electrode after the step of forming the through hole; and removing the support body from the glass substrate after the second wiring is formed.

Advantageous Effects of the Invention

According to the aspects of the present invention, after a wiring is formed on one surface, through holes are formed while the glass substrate is being thinned, and this processing is achieved by etching. This process enables a glass device having a glass substrate with a glass thickness of 300 µm or less to be manufactured more easily.

In manufacturing the glass device, the through holes may be formed while the glass is being thinned by etching with the glass substrate supported on the support body such as a glass carrier. This ensures the ease of handling the glass substrate when conductive portions such as circuits are formed, and allows stable production of a glass device having through electrodes that has a glass substrate thickness of 300 µm or less.

DETAILED DESCRIPTION

Embodiments of the present invention of will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

First Embodiment

Figure 1:
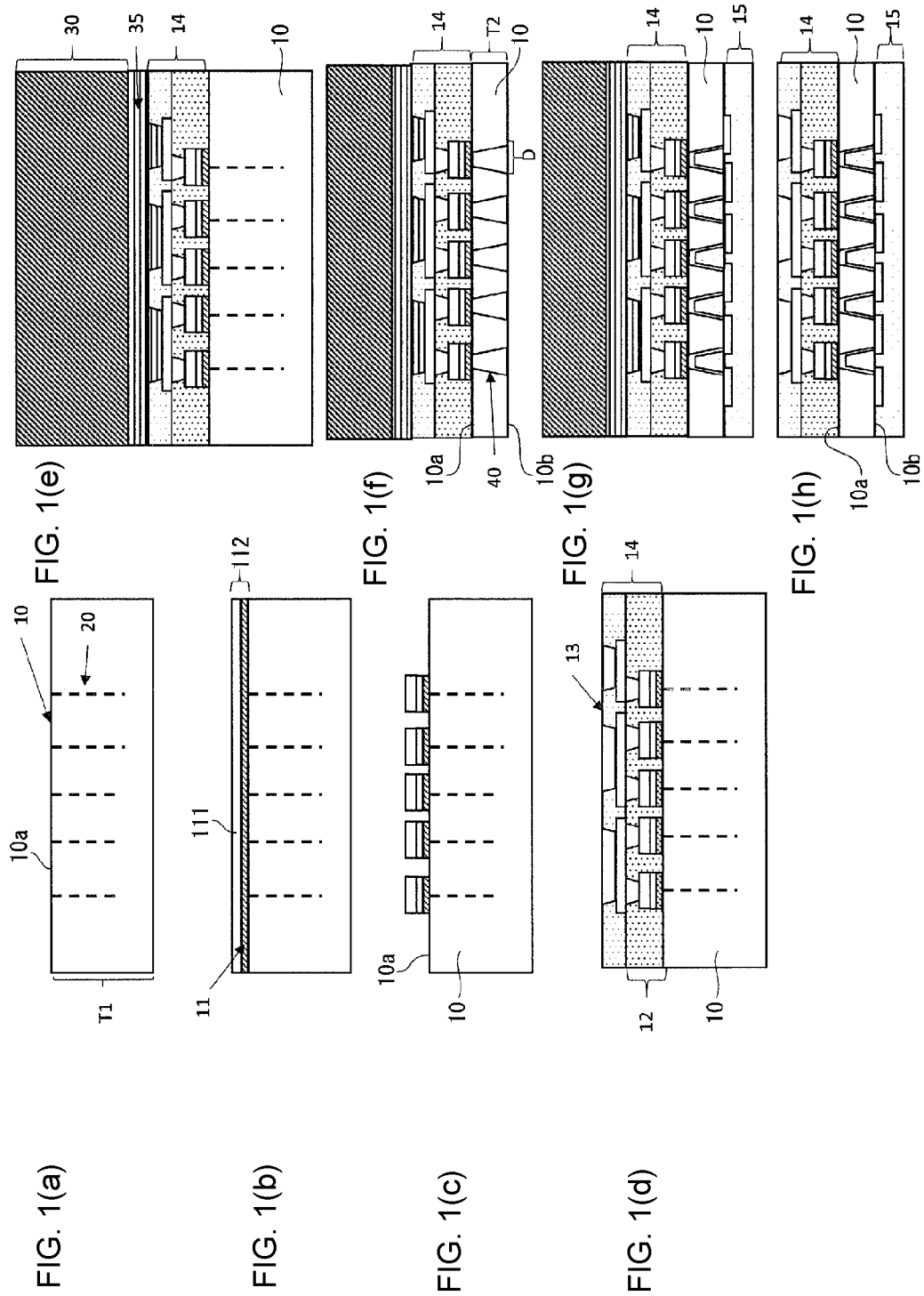
FIGS. 1(a) to 1(h) are cross-sectional views illustrating the process of a method for manufacturing a glass device according to a first embodiment of the present invention.

A method for manufacturing a glass device according to a first embodiment will now be described with reference to FIG. 1.

(Step 1)

First, as illustrated in FIG. 1(a), a glass substrate 10 is irradiated with laser light on a first surface 10a to form a laser modified area 20 which is a starting point of a through hole 40. The laser modified area 20 is formed in a manner to extend downward from the first surface 10a, for example, in a vertical direction, with its lower end within the glass substrate 10.

(Step 2)

Then, as illustrated in FIG. 1(b), a hydrofluoric acid resistant metal film 11 is formed on the first surface 10a of the glass substrate 10 within the range of 10 nm to 500 nm. Then, the hydrofluoric acid resistant metal film 11 is covered with a copper layer 111 within the range of 100 nm to 500 nm. In step 2, a seed layer 112 is formed on the first surface 10a of the glass substrate 10. The material for the hydrofluoric acid resistant metal film 11 may be selected as appropriate from, for example, chromium, nickel, and nickel-chromium.

(Step 3)

Then, as illustrated in FIG. 1(c), a photoresist is formed with an intended pattern. Typically, a dry photoresist is used. In this step, however, the first surface 10a is laminated with a photosensitive film such as RD-1225 manufactured by Hitachi Chemical Company, Ltd, for direct imaging. Next, the determined pattern is imaged and then developed to expose the seed layer 112 formed in step 2. The exposed seed layer is fed with power to provide electrolytic copper plating having a thickness of 2 µm or more and 10 µm or less. The dry film resist no longer needed after the plating is dissolved away, and etching for a seed layer is performed to provide wiring.

(Step 4)

Then, as illustrated in FIG. 1(d), the first surface 10a is laminated with an insulating resin 12, and blind vias are formed in the insulating resin 12 using a laser. Next, the insulating resin 12 is laminated with a dry film resist, and a predetermined pattern is imaged and then developed. Then, the dry film resist no longer needed is dissolved away, and the wiring is provided. After the wiring is produced, a solder resist layer 13 is formed. Thus, a first-surface wiring layer 14 which is a wiring on the first surface 10a is formed.

(Step 5)

Then, as illustrated in FIG. 1(e), a glass carrier 30 corresponding to a support body is bonded to the first-surface wiring layer 14 via an adhesive 35 for temporary bonding. The glass carrier 30 desirably has a thickness within the range of 0.7 mm to 1.5 mm in view of the conveyance after being thinned. The thickness of the glass carrier 30 may be determined as appropriate in accordance with the thickness of the glass substrate. Although the glass carrier 30 is illustrated as the support body, the support body may not be glass, but may be metal or resin.

(Step 6)

Then, as illustrated in FIG. 1(f), on the circuit board formed by bonding the glass carrier 30 and the glass substrate 10 to each other using the adhesive 35, the surface of the glass substrate 10 opposite to the first surface 10a (or the lower surface in the figure) is etched with a hydrogen fluoride solution. The glass area outside the laser modified area 20 is etched by the hydrogen fluoride solution and thinned in parallel with the first surface 10a of the glass substrate 10. When the hydrogen fluoride solution comes into contact with the laser modified area 20, the laser modified area 20 is dissolved preferentially, and thus the through hole 40 is formed. In this manner, while the glass substrate 10 is being thinned, the through hole 40 is formed. That is, thinning and the formation of the through hole 40 are performed in a single etching. The bottom surface of the thinned glass substrate 10 is a second surface 10b on which a second-surface wiring layer 15 is formed.

An etching amount of the hydrogen fluoride solution may be determined as appropriate in accordance with the thickness of the glass device. For example, if the glass substrate 10 used in step 1 has a thickness T1 of 400 μm, the etching amount may be desirably 100 μm or more and 350 μm or less.

The thinned glass substrate 10 preferably has a thickness T2 of 50 μm or more and 300 μm or less.

(Step 7)

Then, as illustrated in FIG. 1(g), steps 1 and 2 are performed as step 7. More specifically, a seed layer for power feeding is formed on the second surface having the through hole 40 formed in it, and a dry film resist is patterned. Next, the seed layer is fed with power to provide electroplating having a thickness of 2 μm or more and 10 μm or less, and then the dry film resist no longer needed is dissolved away. Thus, a through electrode is formed. Then, the seed layer no longer needed is removed, and the surface is coated with an outer layer protective film such as an insulating resin or a solder resist.

The seed layer for power feeding on the second surface may be made from a material different from hydrofluoric acid resistant metals because of the absence of etching using hydrofluoric acid in the subsequent step. In this case, the side surface of the through hole 40 is provided with a metal layer made from a material different from hydrofluoric acid resistant metals. Examples of materials different from hydrofluoric acid resistant metals include Ti, Cu, and electroless Ni, and at least one metal layer made from such a material is formed at least on the side surface of the through hole 40. The material and the number of layers may be determined in any other appropriate manner.

The first wiring and the second wiring each include one or more layers. The number of layers may be determined as appropriate.

If any external connection terminal is needed, an opening may be formed. The coating using an outer layer protective film such as an insulating resin or a solder resist forms the second-surface wiring layer 15 which is wiring on the second surface 10b side.

(Step 8)

Then, as illustrated in FIG. 1(h), the glass carrier 30 temporary bonded at step 5 is removed. Then, the glass device is completed.

Second Embodiment

Figure 2:
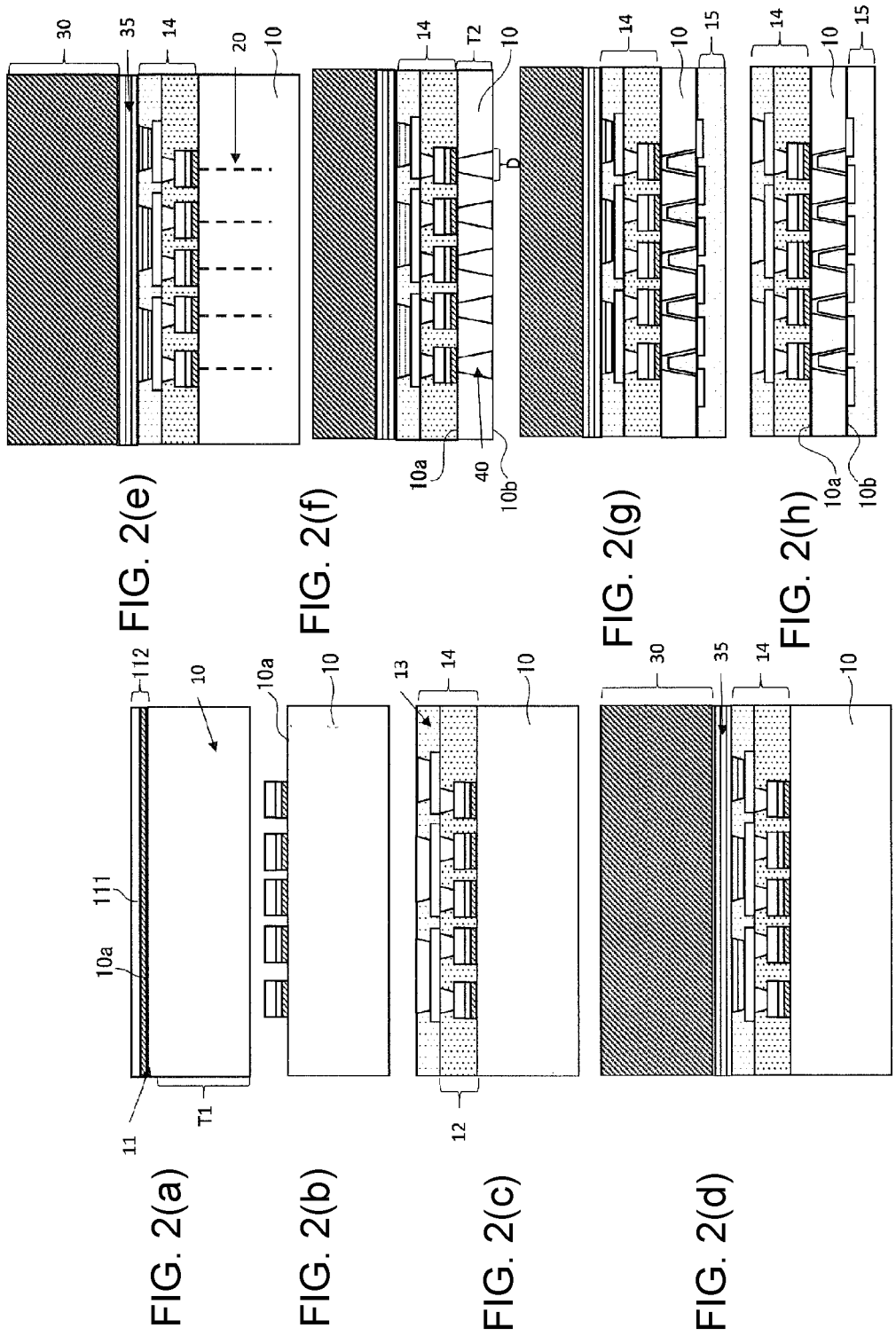
FIGS. 2(a) to 2(h) are cross-sectional views illustrating the process of a method for manufacturing a glass device according to a second embodiment of the present invention.

A method for manufacturing a glass device according to a second embodiment will now be described with reference to FIG. 2.

(Step 1)

First, as illustrated in FIG. 2(a), a hydrofluoric acid resistant metal film 11 is formed within the range of 10 nm to 500 nm on a first surface 10a of a glass substrate 10, and a copper layer 111 is deposited within the range of 100 nm to 500 nm on the hydrofluoric acid resistant metal film 11 to form a seed layer 112. The material for the hydrofluoric acid resistant metal film 11 may be selected as appropriate from, for example, chromium, nickel, and nickel-chromium.

(Step 2)

Then, as illustrated in FIG. 2(b), a photoresist is formed with a predetermined pattern on the first surface 10a of the glass substrate 10. Typically, a dry film resist is used. In this step, however, the first surface 10a of the glass substrate 10 is laminated with a photosensitive film such as RD-1225 for direct imaging, manufactured by Hitachi Chemical Company, Ltd. Next, the predetermined pattern is imaged and then developed to expose the seed layer 112 formed at step 1. The exposed seed layer is fed with power to provide electrolytic copper plating with a thickness of 2 μm or more and 10 μm or less. After the plating, the dry film resist no longer needed is dissolved away, and the seed layer is removed to provide wiring.

(Step 3)

Then, as illustrated in FIG. 2(c), the first surface 10a is laminated using an insulating resin 12, and blind vias are formed in the insulating resin 12 using a laser. Next, the insulating resin 12 is laminated with a dry film resist, and a predetermined pattern is imaged and then developed. Then, the dry film resist no longer needed is dissolved away, and the wiring is provided. After the wiring is produced, a solder resist layer 13 is formed. Thus, a first-surface wiring layer 14 which is a wiring on the first surface 10a is formed.

(Step 4)

Then, as illustrated in FIG. 2(d), a glass carrier 30 is bonded to the first-surface wiring layer 14 using an adhesive 35 for temporary bonding. The glass carrier 30 desirably has a thickness within the range of 0.7 mm to 1.5 mm in view of the conveyance after being thinned. The thickness of the glass carrier 30 may be determined as appropriate in accordance with the thickness of the glass substrate 10.

(Step 5)

Then, as illustrated in FIG. 2(e), the surface opposite to the first surface 10a of the glass substrate 10 (or the lower surface in the figure) is irradiated with laser light to form a laser modified area 20 in the glass substrate 10. The laser modified area 20 is formed to be perpendicular to the hydrofluoric acid resistant metal film 11 formed at step 1, with its lower end within the glass substrate 10.

(Step 6)

Then, as illustrated in FIG. 2(f), on the glass substrate in which the laser modified area 20 is formed at step 5, the surface opposite to the first surface 10a (or the lower surface in the figure) is etched with a hydrogen fluoride solution. The glass area without the laser modified area 20 is etched by the hydrogen fluoride solution, and the glass substrate 10 is thinned in parallel with the first-surface wiring layer 14. When the hydrogen fluoride solution comes into contact with the laser modified area 20, the laser modified area 20 is dissolved preferentially, and thus the through hole 40 is formed. In this manner, while the glass substrate 10 is being thinned, the through hole 40 is formed. The bottom surface of the thinned glass substrate 10 is a second surface 10b on which a second-surface wiring layer 15 is formed.

The etching amount of the hydrogen fluoride solution may be determined as appropriate in accordance with the thickness of the glass device. For example, if the glass substrate used at step 1 has a thickness T1 of 400 μm, the etching amount may desirably be 100 μm or more and 350 μm or less.

The thinned glass substrate 10 preferably has a thickness T2 of 50 μm or more and 300 μm or less.

(Step 7)

Then, as illustrated in FIG. 2(g), an electroless nickel plating layer or an electroless copper plating layer is formed as a seed layer for power feeding on the second surface 10b in which the through hole 40 formed therein, and a dry film resist is patterned. The seed layer is fed with power to provide electroplating having a thickness of 2 μm or more and 10 μm or less. Next, the dry film resist no longer needed is dissolved away to form a through electrode. Then, the seed layer no longer needed is removed, and the surface is coated with an outer layer protective film such as an insulating resin or a solder resist layer. If any external connection terminal is required, an opening may be formed. The coating using an outer layer protective film such as an insulating resin or a solder resist forms the second wiring layer which is wiring on the second surface 10b side.

The first-surface wiring layer 14 and the second-surface wiring layer 15 are each electrically connected to the through electrode formed in the through hole 40 via the hydrofluoric acid resistant metal film 11.

(Step 8)

Then, as illustrated in FIG. 2(h), the glass carrier 30 temporary bonded at step 5 is removed. Thus, the glass device is completed.

(Formation of Laser Modified Area)

The laser modified area 20 is a linear or rod-like area extending downward from the first surface 10a of the glass substrate 10, for example, in a direction perpendicular to the first surface 10a. The laser modified area 20 has a length determined to be smaller than the thickness T1 of the glass substrate 10 at step 1 which is yet to be thinned. More specifically, the length of the laser modified area 20 depends on the thickness of the glass substrate 10 in the final glass device.

The laser modified areas 20 illustrated in FIGS. 1(a) and 2(e) are formed in the glass using laser light having a wavelength λ of 535 nm or less. The wavelength λ preferably falls within the range of 355 nm to 535 nm. Wavelengths λ lower than 355 nm cannot easily attain laser output, making it difficult to form the laser modified area 20 in a stable manner. In contrast, wavelengths λ higher than 535 nm will enlarge the irradiation spot, making it difficult to form the laser modified area 20. In addition, ablation may be used instead of modification due to thermal influence. However, microcracks may easily occur and therefore the laser modified area 20 may easily be damaged.

The laser pulse width desirably ranges from picoseconds to femtoseconds. If the laser pulse width is nanoseconds or longer, it may be difficult to control the amount of energy per pulse, and microcracks may easily occur. Therefore, the laser modified area 20 may easily be damaged.

The laser pulse energy has a preferable value selected depending on the material for the glass substrate 10 and the details of the laser modified area 20. In an example, the laser pulse energy falls within the range of 5 μJ to 150 μJ. If the laser pulse energy is increased, the laser modified area 20 may become proportionally longer.

(Etching using Hydrogen Fluoride Solution)

The etchant that is produced of the hydrogen fluoride solution illustrated in FIGS. 1(f) and 2(f) includes one or more inorganic acids selected from the group consisting of nitric acid, hydrochloric acid, and sulfuric acid, as the hydrogen fluoride solution.

The hydrofluoric acid concentration is desirably, for example, 1.0 wt % or more and 6.0 wt % or less, and preferably 2.0 wt % or more and 5.0 wt % or less.

The inorganic acid concentration falls within the range of 1.0 wt % to 20.0 wt % and preferably 3.0 wt % to 16.0 wt %. Using the hydrogen fluoride solution set within the above ranges, and setting the etching rate at 1.0 μm/min or less can perform etching in a desirable manner. During the etching, the etchant desirably has a temperature of 10° C. or more and 40° C. or less.

Etching using the hydrogen fluoride solution is performed uniformly over the entire surface opposite to the first surface 10a. In this process, the etching is performed in parallel with the first surface 10a toward the first surface 10a until the etchant reaches the laser modified area 20. Then, the glass is thinned. When the hydrogen fluoride solution reaches an end of the laser modified area 20, the laser modified area 20 is preferentially etched, and the through hole 40 is formed along the laser modified area 20.

The etching is performed toward the first surface 10a from the bottom, so that the formed through hole 40 has the shape of a truncated cone tapered toward the first surface 10a from the second surface 10b, that is, the second surface side opening has the larger diameter (bottom). The through hole 40 is processed so that the diameter of the first surface side opening and the diameter of the second surface side opening (bottom opening diameter) satisfy the relationship of, for example, (second surface side opening diameter/first surface side opening diameter) being 1.8 or more and 2.2 or less.

Figure 3:
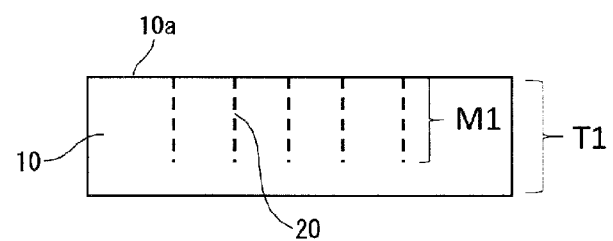
FIG. 3 illustrates the relationship between a laser modified length M1 and a thickness T1 of a glass substrate yet to be thinned (before being reduced in thickness).
Figure 4:
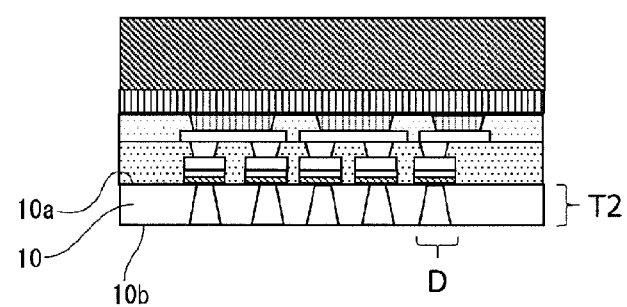
FIG. 4 illustrates the relationship between a diameter D1 of through holes and a thickness T2 of a glass substrate treated using hydrofluoric acid.

As shown in FIGS. 3 and 4, the laser modified area 20 has a length M1 that can be calculated from the glass thickness T2 after the etching using the hydrogen fluoride solution and the second-surface diameter D1 of the through hole, and more specifically, $M1=(D1/2)+T2$ or substantially $M1=(D1/2)+T2$. The expression "substantially $M1=(D1/2)+T2$" means that M1 is substantially equal to $(D1/2)+T2$, and for example, $|M1|/|(D1/2)+T2)|$ is 0.95 or more and 1.05 or less. Thus, the length M1 of the laser modified area 20 may be determined as appropriate based on the diameter D1 of the desired through hole and the glass thickness T2 of after the etching. The etching amount of the hydrogen fluoride solution can be calculated from T1−T2, which is the reduced thickness.

The method for manufacturing a glass device according to the present embodiment enables a glass device having a glass substrate with a glass thickness of 300 μm or less to be manufactured more easily by providing wiring on the first surface 10a and then forming a through hole while thinning the glass substrate by etching.

In manufacturing, the through hole is formed while the glass is being thinned by etching in a state in which the glass substrate 10 is supported on the glass carrier 30. This ensures the ease of handling the glass substrate when conductive portions such as circuits are formed, and allows stable production of a glass device having through electrodes that has a glass substrate of 300 μm or less in thickness.

The etching for thinning the glass and forming the through hole may be performed not in a single process but in multiple processes. In other words, the glass thinning and the through hole formation may be achieved by one or more etching steps.

Figure 5:
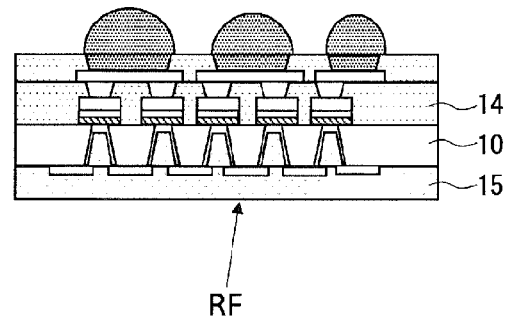
FIG. 5 illustrates an example of an RF-enabled glass device according to the present invention.
Figure 6:
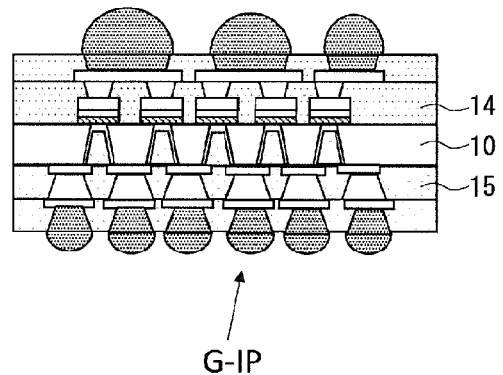
FIG. 6 illustrates a glass interposer as an example of a glass device according to the present invention.

The glass device described above may be used as a glass device such as an RF device illustrated in FIG. 5 or a glass interposer illustrated in FIG. 6. The present embodiment may also be used for a glass device having through electrodes, because the present embodiment easily adjusts the thickness of the glass device and forms the through electrodes in through holes.

REFERENCE SIGNS LIST

10: Glass substrate; 11: Hydrofluoric acid resistant metal film; 12: Insulating resin; 13: Solder resist layer; 14: Wiring layer on first surface (first wiring); 15: Wiring layer on second surface (second wiring); 20: Laser modified area; 30: Glass carrier (support body); 35: Adhesive; 40: Through hole; T1: Thickness of glass substrate; T2: Thickness of etched glass substrate; M1: Length of laser modified area; D1: Second surface side diameter of through hole; RF: RF device; G-IP: Glass interposer.

What is claimed is:

1. A method for manufacturing a glass device having one or more through holes formed in a glass substrate, and a first wiring on a first surface of the glass substrate and a second wiring on a second surface opposite to the first surface being electrically connected to each other via the through holes, comprising the steps of:
   providing the first wiring;
   forming the through holes while thinning the glass substrate by etching;
   providing wiring into the through holes and the second wiring; and
   connecting the first wiring and the second wiring to each other via the wiring into the through holes, wherein
   the glass substrate has the through holes formed with a thickness of 50 μm or more and 300 μm or less, and
   the through holes have a shape of a truncated cone and having a second surface side opening being a bottom surface, and a ratio of (second surface side opening diameter/first surface side opening diameter) which is a relationship between a diameter of a first surface side opening and a diameter of the second surface side opening is 1.8 or more and 2.2 or less.

2. A method for manufacturing a glass device, comprising the steps of:
   providing a first wiring on a first surface of a glass substrate;
   supporting a first wiring side of the glass substrate provided with the first wiring, using a support body;
   forming a laser modified area using a laser light applied to a surface opposite to the first surface, the laser modified area extending from the first surface of the glass substrate toward a surface opposite to the first surface and serving as an area from which a through hole is formed;
   forming a through hole while thinning the glass substrate by etching using a hydrogen fluoride etchant toward the first surface from the surface opposite to the first surface of the glass substrate, after the step of supporting the first wiring side of the glass substrate and the step of forming the laser modified area;
   forming a through electrode inside the through hole, and providing a second wiring on a surface opposite to the first surface of the glass substrate, and connecting the first wiring and the second wiring to each other via the through electrode after the step of forming the through hole; and
   removing the support body from the glass substrate after the second wiring is formed.

3. The method for manufacturing a glass device of claim 2, wherein
   the laser modified area is formed before the first wiring is formed or after the first wiring is provided to the glass substrate.

4. The method for manufacturing a glass device of claim 2, wherein
   the glass substrate after the step of forming the through hole has a thickness of 50 μm or more and 300 μm or less.

5. The method for manufacturing a glass device of claim 2, wherein
   the laser light used to form the laser modified area has a laser pulse width in the range of picoseconds to femtoseconds.

6. The method for manufacturing a glass device of claim 2, wherein
   the through hole has a truncated cone shape having a large diameter in the surface opposite to the first surface, and a relationship of M1=(D1/2)+T2 or substantially M1=(D1/2)+T2 is satisfied wherein
   the large diameter of the through hole in the surface opposite to the first surface is denoted by D1, the glass substrate after the etching using hydrogen fluoride has a thickness denoted by T2, and the laser modified area has a length denoted by M1.

7. The method for manufacturing a glass device of claim 2, wherein
   the through electrode is formed by plating after a seed layer to which a conductive material included in the through electrode is attached is formed on an inner periphery of the through hole.

8. The method for manufacturing a glass device of claim 2, wherein
   the first wiring and the second wiring each comprise one or more layers.

* * * * *